US009863037B2

(12) United States Patent
Kim et al.

(10) Patent No.: US 9,863,037 B2
(45) Date of Patent: Jan. 9, 2018

(54) DEPOSITION MASK AND METHOD OF FABRICATING THE SAME (71) Applicant: Samsung Display Co., Ltd., Yongin, Gyeonggi-Do (KR)

(72) Inventors: Yongtack Kim, Yongin (KR); Jongwoo Kim, Yongin (KR); Jiyoung Moon, Yongin (KR); Minho Oh, Yongin (KR); Yoonhyeung Cho, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 134 days.

(21) Appl. No.: 14/706,691

(22) Filed: May 7, 2015

(65) Prior Publication Data
US 2016/0149133 A1 May 26, 2016

(30) Foreign Application Priority Data

Nov. 24, 2014 (KR) .................. 10-2014-0164423

(51) Int. Cl.
B05D 5/12 (2006.01)
C23C 14/58 (2006.01)
C23C 14/35 (2006.01)
C23C 14/34 (2006.01)
C23C 16/04 (2006.01)
(Continued)

(52) U.S. Cl.
CPC ............ *C23C 14/58* (2013.01); *C23C 14/042* (2013.01); *C23C 14/3407* (2013.01); *C23C 14/3485* (2013.01); *C23C 14/352* (2013.01); *C23C 16/042* (2013.01); *H01J 37/32623* (2013.01)

(58) Field of Classification Search
CPC combination set(s) only.
See application file for complete search history.

(56) References Cited

U.S. PATENT DOCUMENTS

2005/0023133 A1* 2/2005 Lippitt, III ............ C23C 14/358
204/192.25
2008/0305408 A1* 12/2008 Hirose ...................... G03F 1/20
430/5
(Continued)

FOREIGN PATENT DOCUMENTS

JP 2007-308763 A 11/2007
JP 2014-058703 A 4/2014
(Continued)

Primary Examiner — Austin Murata
(74) Attorney, Agent, or Firm — Knobbe Martens Olson & Bear LLP (57) ABSTRACT A deposition mask comprises a mask body comprising a plurality of through holes; and a deposition layer formed on external surfaces of the mask body. A method of manufacturing a deposition mask comprises: installing a deposition mask body in a chamber; forming a magnetic field between a plurality of magnet units within the chamber, wherein the deposition mask body is disposed between the magnet units; and applying voltages to first and second sputtering targets comprising a material to generate electric discharge such that particles of the material are sputtered from the first and second sputtering targets and deposited on the deposition mask body, thereby making a deposition mask with a layer of the material. The voltages having different magnitudes are applied to the first and second sputtering targets.

7 Claims, 12 Drawing Sheets (51) Int. Cl.
 C23C 14/04 (2006.01)
 H01J 37/32 (2006.01)

(56) References Cited

U.S. PATENT DOCUMENTS

| | | | |
|---|---|---|---|
| 2009/0065349 A1* | 3/2009 | Kim | C23C 14/3407 |
| | | | 204/192.12 |
| 2011/0017588 A1 | 1/2011 | Kim et al. | |
| 2011/0049510 A1* | 3/2011 | Yamazaki | H01L 27/1225 |
| | | | 257/43 |
| 2013/0133573 A1 | 5/2013 | Joo et al. | |
| 2013/0192980 A1* | 8/2013 | Ge | H01J 37/32706 |
| | | | 204/192.12 |

FOREIGN PATENT DOCUMENTS

| | | |
|---|---|---|
| KR | 10-0885664 B1 | 2/2009 |
| KR | 10-1082866 A | 11/2011 |
| KR | 10-2013-0057794 A | 6/2013 |

* cited by examiner

DEPOSITION MASK AND METHOD OF FABRICATING THE SAME

RELATED APPLICATION

This application claims the benefit of Korean Patent Application No. 10-2014-0164423, filed on Nov. 24, 2014, in the Korean Intellectual Property Office, the disclosure of which is incorporated herein in its entirety by reference.

BACKGROUND

1. Field

One or more embodiments relate to a deposition mask and a method of fabricating the deposition mask.

2. Description of the Related Art

Generally, an organic light-emitting display apparatus may be used as a display apparatus in mobile devices such as smart phones, tablets, personal computers (PCs), laptop computers, digital cameras, camcorders, and mobile information terminals, or electronic devices such as an ultra-thin televisions, and advertisement panel.

The organic light-emitting display apparatus includes an organic light emissive layer interposed between an anode and a cathode. The organic light-emitting display apparatus includes thin film encapsulation (TFE) for protecting the organic light emissive layer.

The TFE may be formed through a thin film deposition process. The thin film deposition process includes chemical vapor deposition (CVD) or physical vapor deposition (PVD).

A deposition mask may be used to perform the CVD. The deposition mask may be recycled through a cleansing process after depositing a plurality of thin films on a substrate.

SUMMARY

One or more embodiments include a deposition mask and a method of fabricating the deposition mask.

Additional aspects will be set forth in part in the description which follows and, in part, will be apparent from the description, or may be learned by practice of the presented embodiments.

One aspect provides a method of manufacturing a deposition mask, the method comprising: installing a deposition mask body in a chamber; forming a magnetic field between a plurality of magnet units within the chamber, wherein the deposition mask body is disposed between the magnet units; and applying voltages to first and second sputtering targets comprising a material to generate electric discharge such that particles of the material are sputtered from the first and second sputtering targets and deposited on the deposition mask body, thereby making a deposition mask with a layer of the material, wherein voltages having different magnitudes are applied to the first and second sputtering targets.

In the foregoing method, pulsed direct current (DC) voltages may be applied to the first and second sputtering targets. The pulsed DC voltages may be simultaneously applied to the first and second sputtering targets. The pulsed DC voltages may be within a range from about 300 V to about 500 V. The temperature of the chamber may be lower than about 150° C. The layer of the deposition mask may be formed of a metallic material selected from the group consisting of aluminum, aluminum oxide, tungsten and tungsten oxide. The layer of the deposition mask may comprise a first sub-layer formed on and contacting the deposition mask body and a second sub-layer formed on and contacting the first sub-layer, wherein the first sub-layer may be formed of a metal, and the second sub-layer is formed of oxide of the metal, wherein the metal is aluminum or tungsten.

Still in the foregoing method, the deposition layer may be deposited in a range from about 0.1 μm to about 100 μm. The layer may be formed to cover on external surfaces of the deposition mask body comprising a plurality of through holes, the external surfaces comprises a first surface, a second surface facing away from the first surface and an inner sidewall surface of one of the plurality of through holes connecting the first and second surfaces, wherein the layer continuously extends on the first and second surfaces and the inner sidewall surface.

Another aspect provides a deposition mask device comprising: a mask body comprising a plurality of through holes; and a deposition layer formed on external surfaces of the mask body.

In the foregoing device, the external surfaces comprises: a first surface; a second surface facing away from the first surface; and an inner sidewall surface of one of the plurality of through holes connecting the first and second surfaces, wherein the deposition layer continuously extends on the first and second surfaces and the inner sidewall surface. The deposition layer may be formed of a material different from that of the mask body. The external surfaces may comprise an inner circumferential wall surface of each of the plurality of through holes, wherein the deposition layer is formed on the inner circumferential wall surface.

Still in the foregoing device, the deposition layer may be formed as a single layer of a metallic material. The metallic material may be one selected from the group consisting of aluminum, aluminum oxide, tungsten and tungsten oxide. The thickness of the deposition layer may be in a range from about 0.1 μm to about 100 μm. The deposition layer may comprise a first sub-layer formed on and contacting the main body and a second sub-layer formed on and contacting the first sub-layer. The first sub-layer may be formed of a metal, and the second sub-layer is formed of oxide of the metal, wherein the first sub-layer has a thickness greater than that of the second sub-layer.

A further aspect provides a method of manufacturing a display panel, the method comprising: placing the foregoing deposition mask and a substrate such that the deposition mask is placed between the substrate and a deposition material source; and transferring the deposition material from the deposition source to the substrate through the plurality of through holes of the deposition mask thereby depositing the deposition material over the substrate to make a display panel. In the foregoing method, the method may further comprise, subsequently to the depositing, cleaning the deposition mask with nitrogen trifluoride ($NF_3$) gas.

According to one or more embodiments, a method of manufacturing a deposition mask includes installing the deposition mask in a chamber; inducing discharge by applying power to a sputtering target including a deposition material; and forming a magnetic field between a plurality of magnet units and depositing particles sputtered in the sputtering target on the deposition mask, wherein voltages having different magnitudes are applied to the sputtering target.

A plurality of the sputtering targets may be arranged, and wherein pulsed direct current (DC) voltages having different magnitudes are applied to each of the plurality of sputtering targets.

The pulsed DC voltages may be simultaneously applied to each of the plurality of sputtering targets.

The pulsed DC voltages may be in a range from about 300 V to about 500 V.

A temperature of the chamber may be lower than 150° C.

A deposition layer including at least one layer may be formed on the deposition mask.

The deposition layer may include one selected from the group consisting of an aluminum layer deposited on the deposition mask, an aluminum layer and an aluminum oxide layer having a stack structure, a tungsten layer, and a tungsten layer and a tungsten oxide layer having a stack structure.

The deposition layer may be deposited in a range from about 0.1 µm to about 100 µm.

The deposition layer may be formed to cover a first surface of the deposition mask and a second surface of the deposition mask opposite to the first surface.

According to one or more embodiments, a deposition mask includes a mask body in which a plurality of through holes are formed; and a deposition layer formed on an external surface of the mask body and including at least one layer.

The deposition layer may be formed on a first surface of the mask body and a second surface opposite to the first surface.

A material of the deposition layer may be different from a material of the mask body.

The deposition layer may be further formed on an inner circumferential wall of the mask body in which the plurality of through holes are formed.

The deposition layer may include a metal layer of at least one layer.

The deposition layer may include one selected from the group consisting of an aluminum layer deposited on the deposition mask, an aluminum layer and an aluminum oxide layer having a stack structure, a tungsten layer, and a tungsten layer and a tungsten oxide layer having a stack structure.

A thickness of the deposition layer may be in a range from about 0.1 µm to about 100 µm.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. In drawings, like reference numerals refer to like elements throughout and overlapping descriptions shall not be repeated.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. It will be understood that when a layer, area, or component is referred to as being "formed on," another layer, area, or component, it can be directly or indirectly formed on the other layer, area, or component. That is, for example, intervening layers, areas, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Figure 1:
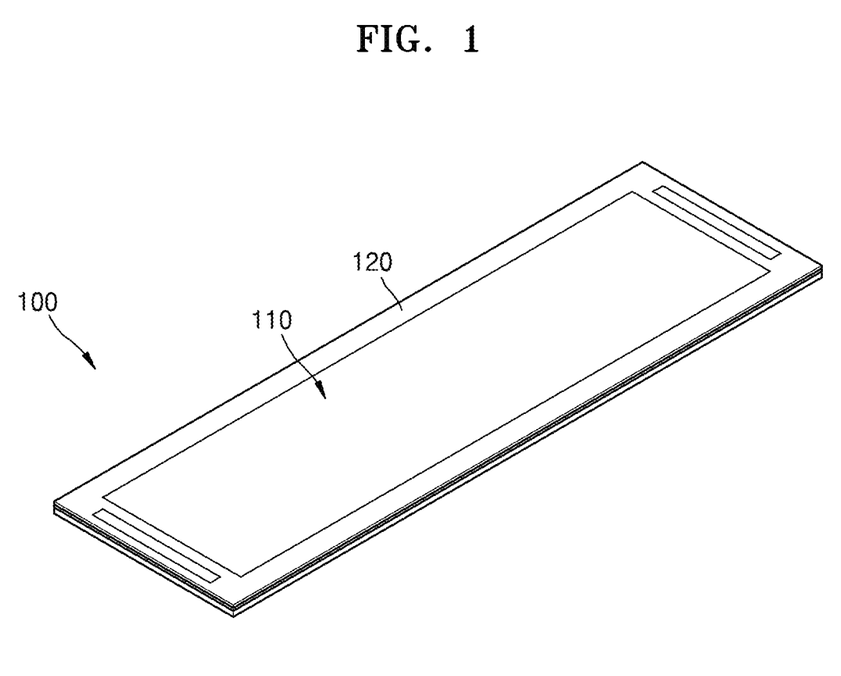
FIG. 1 is a perspective view of a flexible display apparatus that is unfolded according to an embodiment.
Figure 2:
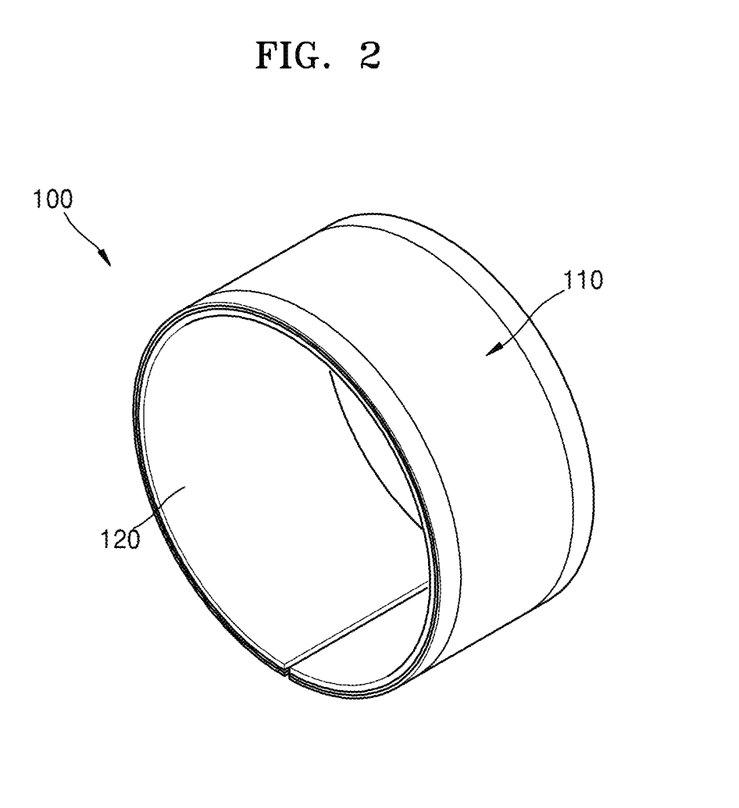
FIG. 2 is a perspective view of the flexible display apparatus of FIG. 1 that is bent.

FIG. 1 is a perspective view of a flexible display apparatus 100 that is unfolded according to an embodiment. FIG. 2 is a perspective view of the flexible display apparatus 100 of FIG. 1 that is bent.

Referring to FIGS. 1 and 2, the flexible display apparatus 100 includes a flexible display panel 110 displaying an image and a flexible case 120 accommodating the flexible display panel 110. The flexible display panel 110 includes not only a device for implementing a screen but also various films such as a touch screen, a polarizing plate, a window cover, etc. The flexible display apparatus 100 may see the image at various angles in an unfolded state or in a bent state.

In the present embodiment, although the flexible display apparatus 100 is described, for example, as a flexible organic light emitting display apparatus, the flexible display apparatus 100 may be one of a liquid crystal display, a field emission display, an electronic paper display, etc.

Figure 3:
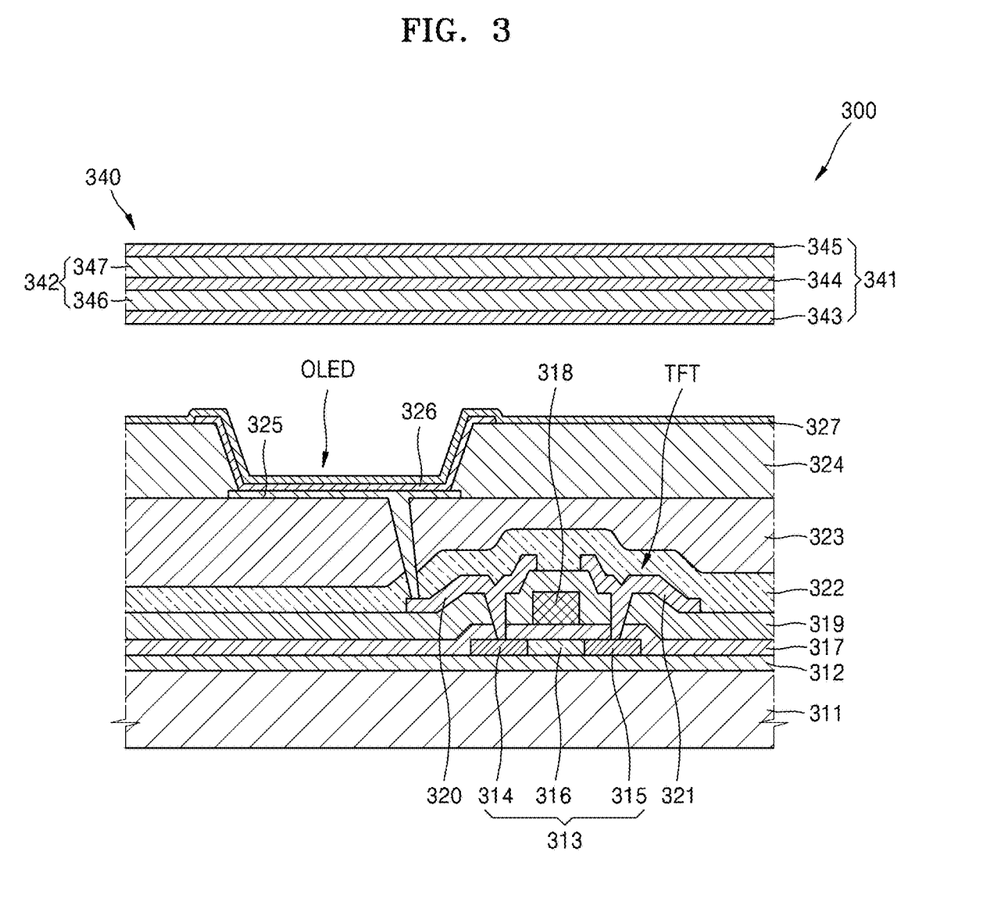
FIG. 3 is a cross-sectional view of a pixel of a flexible display apparatus according to an embodiment.

FIG. 3 is a cross-sectional view of a pixel of a flexible display apparatus 300 according to an embodiment.

In this regard, pixels may include at least one thin film transistor (TFT) and an organic light emitting device or diode (OLED). The TFT does not necessarily have a structure of FIG. 3 and its number and structure may be modified in various ways.

Referring to FIG. 3, the flexible display apparatus 300 includes a flexible substrate 311 and a thin film encapsulation (TFE) 340 facing the flexible substrate 311.

The flexible substrate 311 may be formed of a flexible insulating material.

The flexible substrate 311 may be a polymer substrate formed of polyimide (PI), polycarbonate (PC), polyethersulphone (PES), polyethylene terephthalate (PET), polyethylenenaphthalate (PEN), polyacrylate (PAR), fiber glass reinforced plastic (FRP), etc. According to an embodiment, the flexible substrate 311 may be a glass substrate having a thickness allowing the flexible substrate 311 to be bendable.

The flexible substrate 311 may be transparent, semitransparent, or opaque.

A barrier film 312 may be formed on the flexible substrate 311. The barrier film 312 may entirely cover a top surface of the flexible substrate 311.

The barrier film 312 may be formed of one selected from inorganic materials such as silicon nitride (SiNx), silicon oxynitride (SiOxNy), aluminum oxide (AlOx), aluminum oxynitride (AlOxNy), etc. or organic materials such as acryl, polyimide, polyester, etc.

The barrier film 312 may be formed as a single film or a multilayer film.

The barrier film 312 prevents oxygen and moisture and flattens the top surface of the flexible substrate 311.

The TFT may be formed on the barrier film 312. In the present embodiment, although the TFT is described as a top gate transistor, a TFT having a different structure such as a bottom gate transistor may be provided.

A semiconductor active layer 313 may be formed on the barrier film 312.

The semiconductor active layer 313 includes a source region 314 and a drain region 315 that are formed by being doped with N type impurity ions or P type impurity ions. A channel region 316 that is not doped with impurities is disposed between the source region 314 and the drain region 315.

The semiconductor active layer 313 may be formed of amorphous silicon, an inorganic semiconductor such as poly silicon, or an organic semiconductor.

According to an embodiment, the semiconductor active layer 313 may be formed of an oxide semiconductor. For example, the oxide semiconductor includes an oxide of a metal selected from Groups 4, 12, 13, and 14 such as zinc (Zn), indium (In), gallium (Ga), tin (stannum; Sn), cadmium (Cd), germanium (Ge), and hafnium (Hf), and a combination thereof.

A gate insulating film 317 may be deposited on the semiconductor active layer 313. The gate insulating film 317 may be formed as an inorganic film such as silicon oxide, silicon nitride, or metal oxide. The gate insulating film 317 may be a single layer film or a multilayer film.

A gate electrode 318 may be formed on the gate insulating film 317. The gate electrode 318 includes a single film or a multilayer film such as Au, Ag, Cu, Ni, Pt, Pd, al, Mo, Cr, etc. According to an embodiment, the gate electrode 318 includes an alloy such as Al:Nd, Mo:W, etc.

An interlayer insulating film 319 may be formed on the gate electrode 318. The interlayer insulating film 319 may be formed of an inorganic material such as silicon oxide, silicon nitride, etc. According to an embodiment, the interlayer insulating film 319 includes an organic material.

A source electrode 320 and a drain electrode 321 may be formed on the interlayer insulating film 319. In more detail, a contact hole may be formed by selectively removing the gate insulating film 317 and the interlayer insulating film 319 so that the source electrode 320 may be electrically connected to the source region 314 and the drain electrode 321 may be electrically connected to the drain region 315 through the contact hole.

A passivation film 322 may be formed on the source electrode 320 and the drain electrode 321. The passivation film 322 may be formed of an inorganic material such as silicon oxide, silicon nitride, or an organic material.

A planarizing film 323 may be formed on the passivation film 322. The planarization film 323 includes an organic material such as acryl, polyimide, benzocyclobutene (BCB), etc.

One of the passivation film 322 and the planarization film 323 may be omitted.

The TFT may be electrically connected to the OLED.

The OLED may be formed on the planarization film 323. The OLED includes a first electrode 325, an intermediate layer 326, and a second electrode 327.

The first electrode 325 may function as an anode and may be formed of various conductive materials. The first electrode 325 includes a transparent electrode or a reflective electrode. For example, when the first electrode 325 is used as a transparent electrode, the first electrode 325 includes a transparent conductive film formed of ITO, IXO, ZnO, $In_2O_3$, etc. When the first electrode 325 is used as the reflective electrode, the first electrode 325 may be formed as a reflection film formed of Ag, Mg, Al, Pt, Pd, Au, Ni, Nd, Ir, Cr, and a combination thereof. In this regard, a transparent conductive film formed of ITO, IZO, ZnO, $In_2O_3$, etc. may be formed on an upper portion of the reflection film.

A pixel defining film 324 partially covers the planarization film 323 and the first electrode 325. The pixel defining film 324 defines an emission region of each pixel by surrounding an edge of the first electrode 325. The first electrode 325 may be patterned for each pixel.

The pixel defining film 324 may be formed as an organic film or an inorganic film. For example, the pixel defining film 324 may be formed of an organic material such as polyimide, polyamide, BCB, acryl resin, phenol resin, etc. or an inorganic material such as silicon nitride, etc.

The pixel defining film 324 may be a single film or a multiple film.

The intermediate layer 326 may be formed on a region of the first electrode 325 exposed by etching a part of the pixel defining film 324. In the present embodiment, the intermediate layer 326 may be formed through a deposition process.

The intermediate layer 326 may include an emissive layer. For example, the intermediate layer 326 may include the emissive layer and may further include at least one of a hole injection layer (HIL), a hole transport layer (HTL), an electron transport layer (ETL), and an electron injection layer (EIL) but the present embodiment is not limited thereto. The intermediate layer 325 may include the emissive layer and may further include various other functional layers.

Holes and electrons that are injected into the first electrode 325 and the second electrode 327 may be combined with each other in the emissive layer to generate light of a desired color.

The second electrode 327 may be formed on the intermediate layer 326.

The second electrode 327 may function as a cathode. The second electrode 327 includes a transparent electrode or a reflective type electrode. For example, when the second electrode 327 is used as the transparent electrode, the second electrode 327 may be formed by depositing a metal having a small work function such as Li, Ca, LiF/Ca, LiF/Al, Al, or Mg, and a combination of these on the intermediate layer 326. In this regard, a transparent conductive film such as ITO, IZO, ZnO, $In_2O_3$, etc. may be formed on the metal and the combination. When the second electrode 327 is used as the reflective type electrode, the second electrode 327 may be formed of Li, Ca, LiF/Ca, LiF/Al, Al, Mg, and a combination of these.

In the present embodiment, the first electrode 325 may function as the anode, and the second electrode 327 may function as the cathode but the present invention is not limited thereto. For example, the first electrode 325 may function as the cathode, and the second electrode 327 may function as the anode.

According to an embodiment, a plurality of pixels may be formed on the flexible substrate 311, and a red, green, blue, or a white color may be implemented for each pixel but the present embodiment is not limited thereto.

According to an embodiment, the intermediate layer 326 may be commonly formed on the first electrode 325 irrespective of a location of a pixel. In this regard, the emissive layer may be formed by vertically stacking layers including an emissive material that emits red, green, and blue light or by mixing emissive materials that emit the red, green, and blue light.

According to an embodiment, as long as white light may be emitted, a combination of other colors may be possible. A color conversion layer that converts the emitted white light into a predetermined color or a color filter may be further provided.

The TFE 340 may be formed to protect the OLED from external moisture or oxygen. According to an embodiment, the TFE 340 may be formed by alternately stacking an inorganic film 341 and an organic film 342 on the OLED.

For example, the TFE 340 may have a structure in which at least one inorganic film 341 and at least one organic film 342 are stacked. The inorganic film 341 includes a first inorganic film 343, a second inorganic film 344, and a third inorganic film 345. The organic film 342 includes a first organic film 346 and a second organic film 347.

The inorganic film 341 may be formed of one selected from the group consisting of $SiO_2$, $SiNx$, aluminum oxide ($Al_2O_3$), titanium oxide ($TiO_2$), zirconium oxide ($ZrOx$), or zinc oxide ($ZnO$). The organic film 342 may be formed of one selected from the group consisting of epoxy, polyimide, polyethylene terephthalate, polycarbonate, polyethylene, and polyacrylate.

The TFE 340 may be formed through plasma enhanced chemical vapor deposition (PECVD).

In more detail, a substrate is installed and deposited in a deposition chamber. PECVD may mount a deposition mask on the substrate. The deposition mask may be subject to a cleansing process for recycling after performing a deposition process several times. During the cleansing process, the deposition mask uses nitrogen trifluoride ($NF_3$) gas. The deposition mask reacts with fluorine over time, which causes corrosion of surfaces and edges of the deposition mask.

In the present embodiment, a deposition layer may be formed on the deposition mask to improve an anti-corrosion property. The layer may be formed as a single layer or may include multiple sub-layers.

Figure 4:
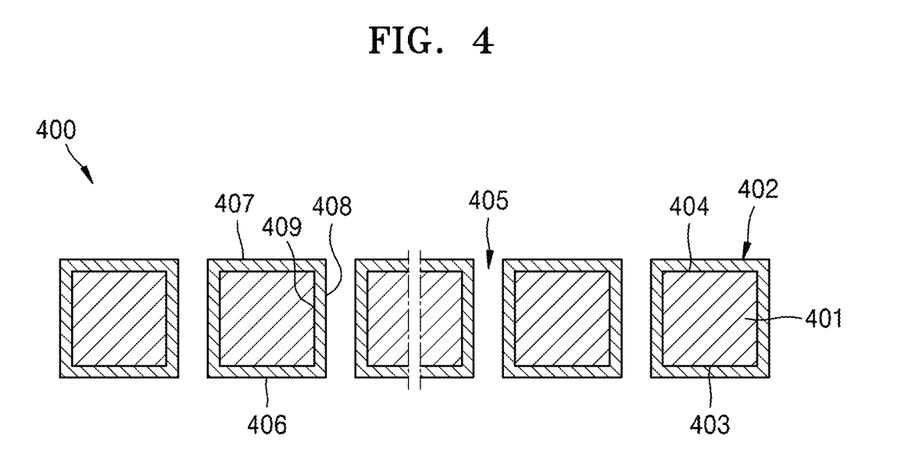
FIG. 4 is a cross-sectional view of a deposition mask according to an embodiment.

FIG. 4 is a cross-sectional view of a deposition mask 400 according to an embodiment.

Referring to FIG. 4, the deposition mask 400 includes a mask body 401 and a deposition layer 402.

The mask body 401 includes a first surface 403 facing a substrate that is to be deposited and a second surface 404 opposite to the first surface 403. A plurality of through holes 405 may be formed in the mask body 401. Shapes of the through holes 405 may be the same as those of thin film portions formed on a display apparatus.

For convenience of manufacturing, a mother substrate may be used to form devices, elements, or features of a plurality of display apparatuses thereon, thereby simultaneously manufacturing the plurality of display apparatuses. According to an embodiment, shapes of the through holes 405 may be the same as those of the inorganic film portions 341 of a plurality of TFEs (340 of FIG. 3) formed on the mother substrate.

The mask body 401 may be formed as a metal plate having high durability and strength. The mask body 401 may be a magnetic body. In the present embodiment, the mask body 401 may be a variety of metals such as stainless steel (for example, SUS defined in the Japanese Industrial Standard), invar, or a nickel alloy.

The deposition layer 402 may be formed on an external surface of the mask body 401.

In more detail, the deposition layer 402 includes a first portion 406 deposited on a first surface 403 of the mask body 401 and a second portion 407 formed on the second surface 404 of the mask body 401. A third portion 408 may be further formed on an inner circumferential surface 409 of the mask body 401 in which the through holes 405 are formed. The first portion 406, the second portion 407, and the third portion 408 may be integrally formed.

The deposition layer 402 may be formed on external surfaces of the mask body 401. In the present embodiment, the deposition layer 402 may be formed through high speed and high density magnetron sputtering. High speed and high density magnetron sputtering may improve an adhesive property between the mask body 401 and the deposition layer 402 and easily control stress generated from the deposition layer 402.

A material of the deposition layer 402 may be different from that of the mask body 401. The deposition layer 402 includes a metal layer. According to an embodiment, the deposition layer 402 includes an aluminum layer or a tungsten layer.

A thickness of the deposition layer 402 may be in the range from about 0.1 μm to about 100 μm. The deposition layer 402 having a thickness in the foregoing range may increase a lifespan of the deposition mask 400 while avoiding negative effects to the precision of the deposition mask 400.

The deposition mask 400 may have a structure of two or more layers.

Figure 5:
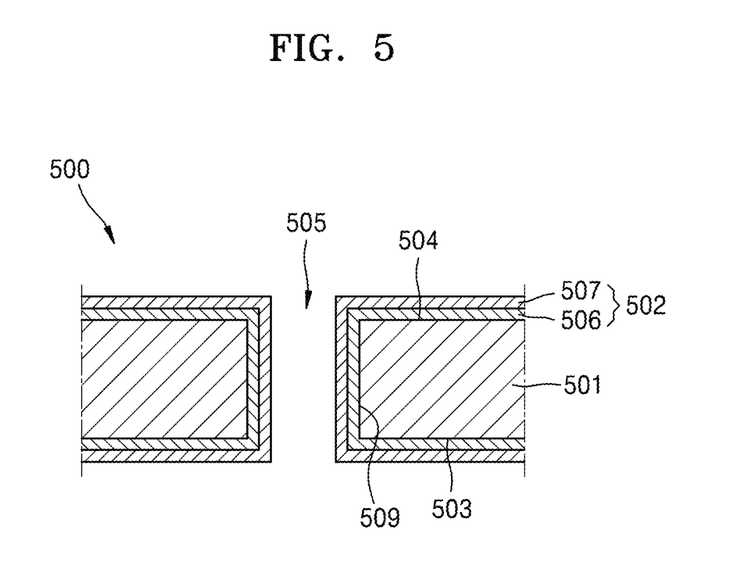
FIG. 5 is a cross-sectional view of a deposition mask according to another embodiment.

Referring to FIG. 5, a deposition mask 500 includes a mask body 501 and a deposition layer 502.

A plurality of through holes 505 may be formed in the mask body 501.

The deposition layer 502 includes a first deposition layer 506 and a second deposition layer 507 formed on the first deposition layer 506. The first deposition layer 506 may be directly coated on a first surface 503 of the mask body 501, a second surface 505 opposite to the first surface 503, and an inner circumferential wall 509 of each of the through holes 505. The second deposition layer 507 may be deposited on external surfaces of the first deposition layer 506. In embodiments, the second deposition layer 507 may be formed on an inner circumferential wall surface of each hole. In other embodiments, the second deposition layer 507 is not formed on an inner circumferential wall surface of each hole.

According to an embodiment, the first deposition layer 506 includes an aluminum layer or a tungsten layer. The second deposition layer 507 includes an aluminum oxide layer such as aluminum oxide ($Al_2O_3$) or a tungsten oxide layer such as tungsten oxide ($WOx$).

A thickness of the deposition layer 502 may be in the range from about 0.1 μm to about 100 μm.

The deposition layer 502 may be deposited on a mask by using a sputtering apparatus.

Figure 6:
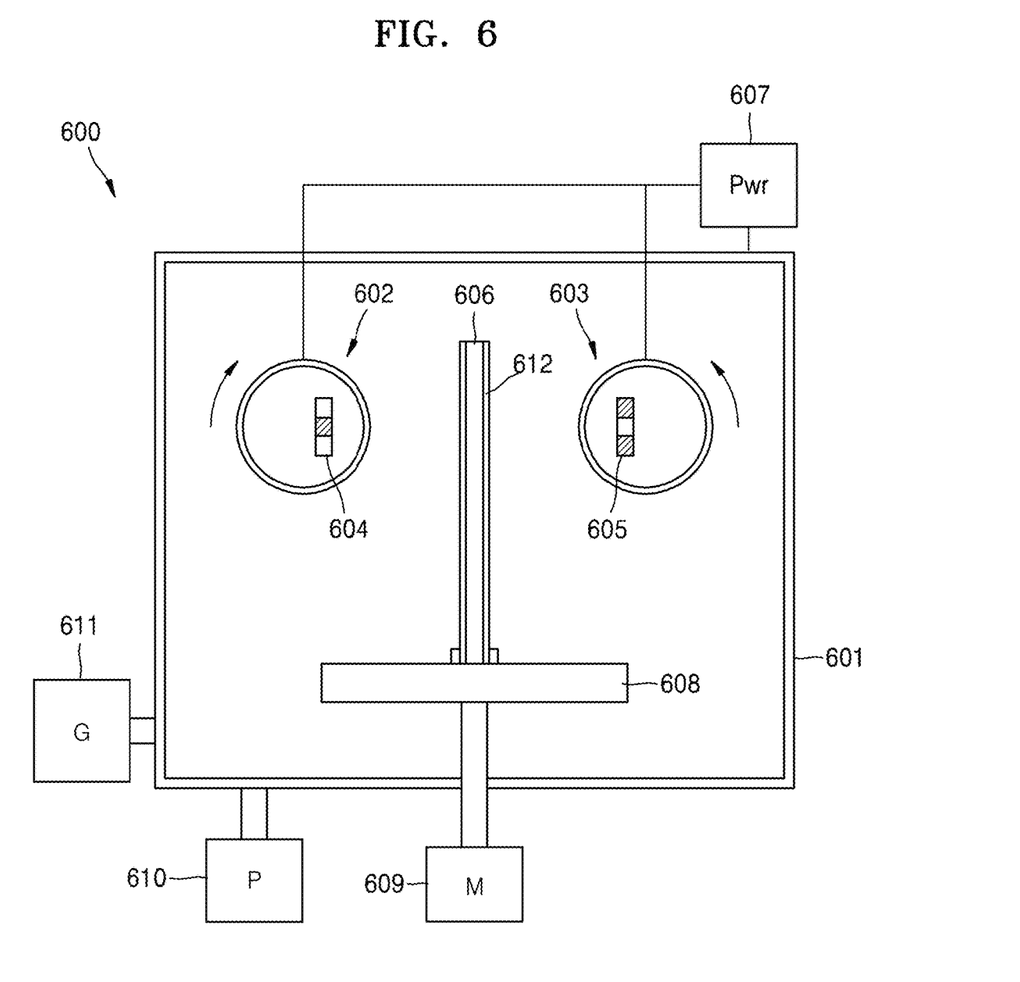
FIG. 6 is a diagram of a sputtering apparatus according to an embodiment.

FIG. 6 is a diagram of a sputtering apparatus 600 according to an embodiment.

Referring to FIG. 6, a chamber 601 providing a deposition space is provided in the sputtering apparatus 600. The chamber 601 may be a vacuum chamber for a stable deposition of a material that is to be deposited.

A plurality of sputtering targets 602 and 603 may be installed in the chamber 601. The sputtering targets 602 and 603 include a first sputtering target 602 and a second sputtering target 603 disposed to face the first sputtering target 602. In the present embodiment, a plurality of the first sputtering targets 602 and a plurality of the second sputtering targets 603 may be installed.

The first sputtering target 602 and the second sputtering target 603 may have cylindrical shapes. The first sputtering target 602 and the second sputtering target 603 may have rectangular shapes.

The first sputtering target 602 and the second sputtering target 603 include a deposition layer material that is to be deposited on a mask 606.

A first magnet unit 604 may be installed in the first sputtering target 602. A second magnet unit 605 may be installed in the second sputtering target 603. According to an embodiment, the first magnet unit 604 and the second magnet unit 605 may be respectively installed behind the first sputtering target 602 and the second sputtering target 603. In the illustrated embodiment, at least a portion of the sputtering target 602 is placed between the magnet unit 604 and the mask 606, and at least a portion of the sputtering target 603 is placed between the magnet unit 605 and the mask 606.

The first magnet unit 604 and the second magnet unit 605 may be permanent magnets or electromagnets.

In embodiments, the first sputtering target 602 and the second sputtering target 603 may rotate in opposite directions by a target rotation apparatus coupled to a target holder. For example, when the first sputtering target 602 rotates in a clockwise direction, the second sputtering target 603 may rotate in a counterclockwise direction. Rotation directions of the first sputtering target 602 and the second sputtering target 603 are not necessarily limited thereto.

According to an embodiment, various apparatuses may be combined in the first sputtering target 602 and the second sputtering target 603 like an angle adjusting apparatus for rotating the first magnet unit 604 and the second magnet unit 605 at a predetermined angle or a yolk for concentrating magnetic fields of the first magnet unit 604 and the second magnet unit 605.

A power source unit 607 providing a power supply may be connected to the first sputtering target 602 and the second sputtering target 603. A pulsed direct current (DC) may be applied to the power source unit 607. For example, a positive electrode may be connected to the chamber 601, and a negative electrode may be connected to the first sputtering target 602 and the second sputtering target 603.

A single power source unit 607 may be provided to distribute and supply a discharge electrode to the first sputtering target 602 and the second sputtering target 603 or a plurality of power source units 607 may be provided to supply a discharge electrode to each of the first sputtering target 602 and the second sputtering target 603.

A mask 606 on which particles sputtered from the first sputtering target 602 and the second sputtering target 603 are deposited may be disposed in the chamber 601. The mask 606 may be disposed between the first sputtering target 602 and the second sputtering target 603. The mask 606 may be disposed in a direction perpendicular to a direction in which the first sputtering target 602 and the second sputtering target 603 are aligned. In the illustrated embodiment, the targets 602 and 603 are aligned in a horizontal direction and the mask 604 is upright in a vertical direction.

In the present embodiment, the mask 606 may be disposed between the first sputtering target 602 and the second sputtering target 603 but is not limited thereto. The mask 606 may be disposed on upper or lower portions of the first sputtering target 602 and the second sputtering target 603.

The mask 606 may be mounted on a mask holder 608. The mask 606 may be detached from the mask holder 608. The mask holder 608 on which the mask 606 is mounted may move right and left by a driving force of a driving motor 609.

Meanwhile, a vacuum pump 610 for forming the chamber 601 in a vacuum manner and a gas supply unit 611 for supplying gas into the chamber 601 may be connected to one side of the chamber 601. Sputtering gas such as argon (Ar) or reactivity gas such as oxygen (O2) may be supplied through the gas supply unit 611.

A film forming process using the sputtering apparatus 600 having the structure described above will now be described.

The mask 606 is installed in the chamber 601. The mask 606 is mounted on the mask holder 608. The mask holder 608 may move right and left by the driving force of the driving motor 609. The chamber 601 may be in a vacuum state by using the vacuum pump 610.

Discharge is induced by applying power to the first sputtering target 602 and the second sputtering target 603 that include a deposition material. The deposition material may be aluminum.

In more detail, the first sputtering target 602 and the second sputtering target 603 rotate. The first sputtering target 602 rotates in the clockwise direction. The second sputtering target 603 rotates in the counterclockwise direction. Gas is supplied into the chamber 601 through the gas supply unit 611 while rotating the first sputtering target 602 and the second sputtering target 603. The gas may be argon (Ar) that is inert gas.

Thereafter, a glow discharge of the sputtering gas is induced by applying a negative voltage to the first sputtering target 602 and the second sputtering target 603 through the power source unit 607.

Voltages having different magnitudes may be applied to the first sputtering target 602 and the second sputtering target 603. A plurality of first sputtering targets 602 and a plurality of second sputtering targets 603 are installed. Pulsed DC voltages having different magnitudes are applied to the first sputtering target 602 and the second sputtering target 603. The pulsed DC voltages may be simultaneously applied to the first sputtering target 602 and the second sputtering target 603. The applied pulsed DC voltage may be in the range from about 300 V to about 500 V. For example, 380 V may be applied to a pair of the first sputtering target 602 and the second sputtering target 603, and 420 V may be applied to another pair of the first sputtering target 602 and the second sputtering target 603. To avoid negative effects of too high or too low voltage, the pulsed DC voltage may be within an appropriate range, for example, from 300 V to 500 V.

Plasma generated by the glow discharge is concentrated between the first sputtering target 602 and the second sputtering target 603 by the magnetic field formed by the first magnet unit 604 and the second magnet unit 605.

When the positively-ionized argon gas collides with the first sputtering target 602 and the second sputtering target 603 that are negatively charged, target atoms or atom clusters are sputtered from the first sputtering target 602 and the second sputtering target 603. The particles sputtered from the first sputtering target 602 and the second sputtering target 603 are discharged to a vapor phase. The particles may be confined in a space between the first sputtering target 602 and the second sputtering target 603 and may be deposited on the mask 606.

Meanwhile, a temperature of the chamber 601 may be lower than about 150° C. to avoid deflection of the mask 606.

The deposition layer 612 may be formed on the external surface of the mask 606 through the sputtering process described above.

As described above, if the pulsed DC having different intensities is applied to a pair of the first sputtering target 602 and the second sputtering target 603 and another pair of the first sputtering target 602 and the second sputtering target 603 that are adjacent to each other, a plasma condition may differ due to a voltage difference. Thus, a complex combination of compression remaining stress and tensile remaining stress may minimize a compression remaining stress value, and result in deposition of the deposition layer 612 on the mask 606. Therefore, no peeling or cracking occurs in the deposition layer 612 with respect to the mask 606.

FIGS. 7A through 7D are pictures showing a surface change of a deposition mask according to an embodiment.

Figure 7A:
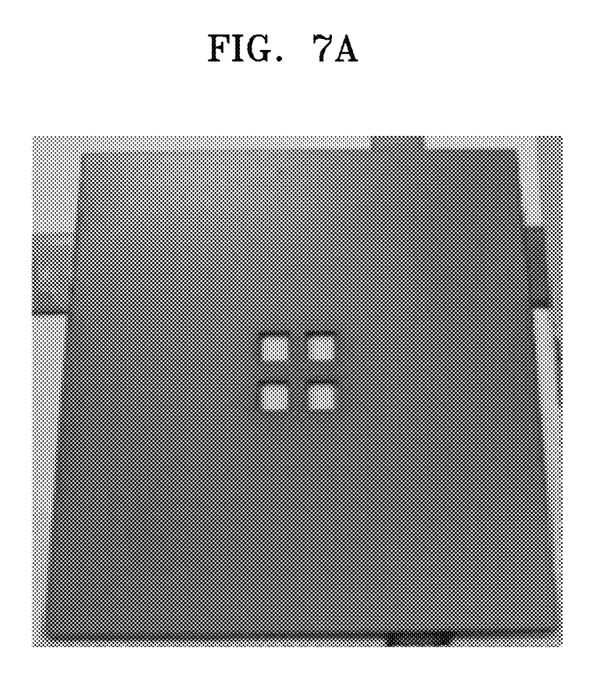
FIGS. 7A through 7D are pictures showing a surface change of a deposition mask according to an embodiment.

The mask of FIG. 7A is a mask on which no deposition layer is formed according to a comparative example. The mask is formed of stainless steel.

Figure 7B:
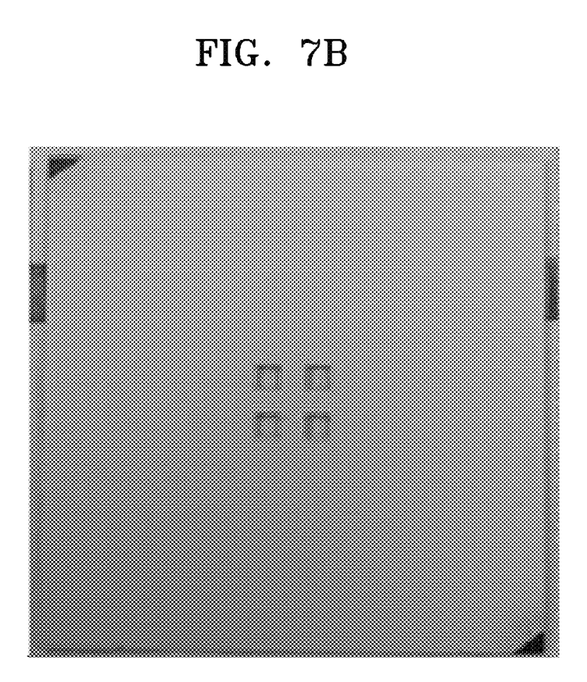

The mask of FIG. 7B is a mask on which a deposition layer is formed according to an embodiment. The mask is formed of stainless steel. The deposition layer is formed on the mask through high speed and high density magnetron sputtering. The deposition layer includes an aluminum layer and is deposited at a thickness of about 5 μm.

The masks of FIGS. 7A and 7B are in a state before being exposed to nitrogen trifluoride ($NF_3$) gas during a cleansing process. No surface corrosion occurs in both the masks of FIGS. 7A and 7B.

Figure 7C:
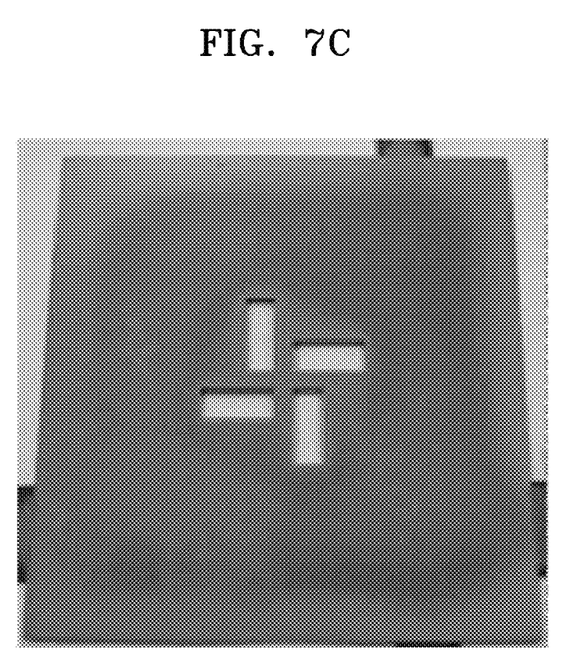

The mask of FIG. 7C is in a state before the mask is exposed to the nitrogen trifluoride ($NF_3$) gas for 25 hours during the cleansing process of the mask of FIG. 7A. The mask of FIG. 7D is in a state before the mask is exposed to the nitrogen trifluoride ($NF_3$) gas for 25 hours during the cleansing process of the mask of FIG. 7B.

Figure 7D:
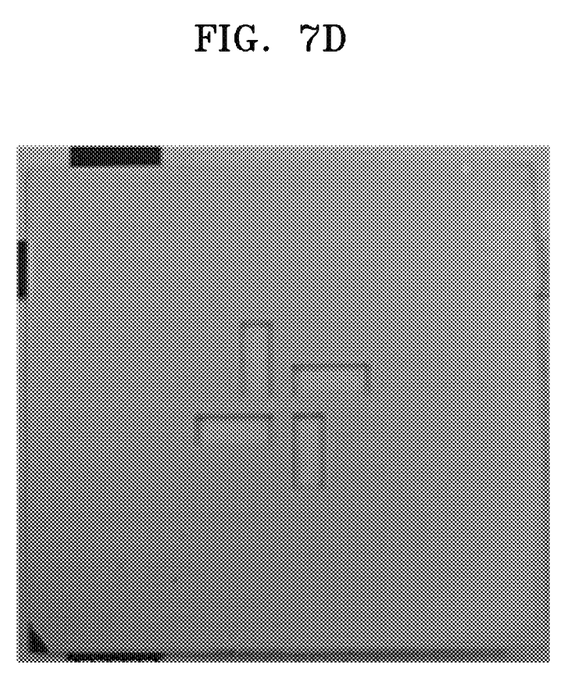

If the mask of FIG. 7C is exposed to the nitrogen trifluoride ($NF_3$) gas, a surface corrosion occurs over time, whereas, even though the mask of FIG. 7D is exposed to the nitrogen trifluoride ($NF_3$) gas for a long period of time, no surface corrosion occurs.

As described above, a deposition layer is deposited on the mask through sputtering. Thus, a lifespan of the mask increases by at least 5 times.

Figure 8A:
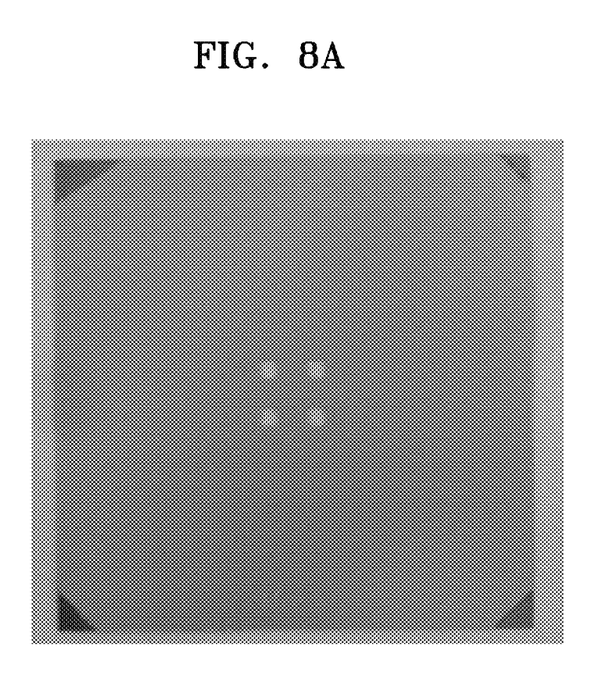
FIGS. 8A and 8B are pictures showing a surface change of a deposition mask according to another embodiment.
Figure 8B:
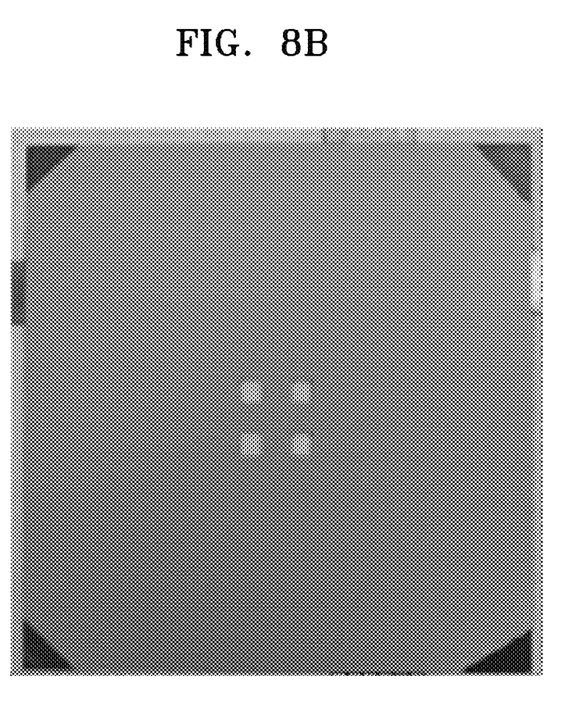

FIGS. 8A and 8B are pictures showing a surface change of a deposition mask according to another embodiment.

The mask of FIG. 8A is a mask on which a deposition layer is formed according to an embodiment and is in a state before the mask is exposed to nitrogen trifluoride ($NF_3$) gas during a cleansing process. The mask of FIG. 8B is in a state before the mask is exposed to the nitrogen trifluoride ($NF_3$) gas for 25 hours during the cleansing process of the mask of FIG. 8A.

The masks of FIGS. 8A and 8B are formed of stainless steel. The deposition layer is formed on the masks through high speed and high density magnetron sputtering. The deposition layer has a two layer structure including an aluminum layer and an aluminum oxide layer stacked with the aluminum layer. In one embodiment, the aluminum layer has a thickness of about 1 μm, the aluminum oxide layer has a thickness of about 0.5 μm.

As shown in FIGS. 8A and 8B, if the deposition layer is formed on an external surface of the masks through sputtering, no damage occurs on the masks even though time has elapsed. Thus, a lifespan of a mask may increase.

As described above, according to one or more embodiments, a deposition mask and a method of manufacturing the deposition mask according to embodiments of the present invention may increase a lifespan of the deposition mask.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a deposition mask, the method comprising:
   installing a deposition mask body in a chamber;
   forming a magnetic field between a plurality of magnet units within the chamber, wherein the deposition mask body is disposed between the magnet units; and
   applying voltages to first and second sputtering targets comprising a material to generate electric discharge such that particles of the material are sputtered from the first and second sputtering targets and deposited on the deposition mask body, thereby making a deposition mask with a layer of the material,
   wherein voltages having different magnitudes are applied to the first and second sputtering targets,
   wherein the layer of the deposition mask comprises a first sub-layer formed on and contacting the deposition mask body and a second sub-layer formed on and contacting the first sub-layer, wherein the first sub-layer is formed of a metal, and the second sub-layer is formed of oxide of the metal, and wherein the metal is aluminum or tungsten.

2. The method of claim 1, wherein pulsed direct current (DC) voltages are applied to the first and second sputtering targets.

3. The method of claim 2, wherein the pulsed DC voltages are simultaneously applied to the first and second sputtering targets.

4. The method of claim 2, wherein the pulsed DC voltages are within a range from about 300 V to about 500 V.

5. The method of claim 1, wherein a temperature of the chamber is lower than about 150° C.

6. The method of claim 1, wherein the deposition layer is deposited in a range from about 0.1 μm to about 100 μm.

7. The method of claim 1, wherein the deposition mask body comprises a plurality of through holes and the layer on the deposition mask continuously extends on a first surface, a second surface facing away from the first surface and an inner sidewall surface of one of the plurality of through holes connecting the first and second surfaces.

* * * * *